United States Patent
Van Buel et al.

(10) Patent No.: US 7,113,258 B2
(45) Date of Patent: Sep. 26, 2006

(54) LITHOGRAPHIC APPARATUS

(75) Inventors: Henricus Wilhelmus Maria Van Buel, Eindhoven (NL); Keith Frank Best, Prunedale, CA (US); Joseph J. Consolini, Costa Mesa, CA (US); Joeri Lof, Eindhoven (NL); Edwin Ross Shafer, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/939,999

(22) Filed: Sep. 14, 2004

(65) Prior Publication Data

US 2005/0140951 A1  Jun. 30, 2005

Related U.S. Application Data

(63) Continuation-in-part of application No. 10/840,360, filed on May 7, 2004, and a continuation-in-part of application No. 10/803,104, filed on Mar. 18, 2004, which is a continuation of application No. 10/043,271, filed on Jan. 14, 2002, now Pat. No. 6,768,539.

(30) Foreign Application Priority Data

Jan. 15, 2001 (EP) ................... 01300302

(51) Int. Cl.
*G03B 27/42* (2006.01)
*G03B 27/58* (2006.01)
*G01B 11/00* (2006.01)
*G03B 27/52* (2006.01)

(52) U.S. Cl. .............. 355/53; 355/72; 356/401

(58) Field of Classification Search .......... 355/53, 355/67, 72, 75, 77, 30; 356/399, 400, 401; 438/401; 359/380, 886; 430/20, 320; 250/492.2
See application file for complete search history.

(56) References Cited

U.S. PATENT DOCUMENTS

| 3,752,589 A | 8/1973 | Kobayashi |
| 4,046,985 A | 9/1977 | Gates |
| 4,408,875 A | 10/1983 | Majima |
| 4,492,459 A | 1/1985 | Omata |
| 4,650,983 A | 3/1987 | Suwa |
| 4,798,470 A | 1/1989 | Moriyama et al. |
| 4,853,745 A | 8/1989 | Kamiya et al. |
| 4,952,060 A | 8/1990 | Ina et al. |

(Continued)

FOREIGN PATENT DOCUMENTS

EP  0 756 207 A3  1/1997

(Continued)

OTHER PUBLICATIONS

Patent Abstract of Japan, JP11340120, published Dec. 1999.

(Continued)

*Primary Examiner*—Peter B. Kim
(74) *Attorney, Agent, or Firm*—Pillsbury Winthrop Shaw Pittman, LLP

(57) ABSTRACT

A lithographic projection apparatus is provided with an optical system built into the wafer table for producing an image of a wafer mark that is provided on the back side of the wafer. The image is located at the plane of the front side of the wafer and can be viewed by an alignment system from the front side of the wafer. Simultaneous alignment between marks on the back and front of the wafer and a mask can be performed using a pre-existing alignment system. The lithographic projection apparatus is further provided with immersion system for providing a fluid between the lens and the substrate.

18 Claims, 7 Drawing Sheets

U.S. PATENT DOCUMENTS

| | | | |
|---|---|---|---|
| 5,229,872 A | 7/1993 | Mumola | |
| 5,296,891 A | 3/1994 | Vogt et al. | |
| 5,298,988 A | 3/1994 | Everett et al. | |
| 5,361,132 A | 11/1994 | Farn | |
| 5,483,348 A | 1/1996 | Komatsu et al. | |
| 5,523,193 A | 6/1996 | Nelson | |
| 5,530,552 A | 6/1996 | Mermagen et al. | |
| 5,715,039 A * | 2/1998 | Fukuda et al. | 355/53 |
| 5,721,605 A | 2/1998 | Mizutani | |
| 5,777,747 A | 7/1998 | Tanaka | |
| 5,843,831 A | 12/1998 | Chung et al. | |
| 5,874,190 A | 2/1999 | Tanaka | |
| 5,894,530 A | 4/1999 | Wilt | |
| 5,923,990 A | 7/1999 | Miura | |
| 5,929,973 A | 7/1999 | Kakizaki et al. | |
| 5,929,997 A | 7/1999 | Lin | |
| 5,969,441 A | 10/1999 | Loopstra et al. | |
| 5,985,764 A | 11/1999 | Lin et al. | |
| 6,046,792 A | 4/2000 | Van Der Werf et al. | |
| 6,376,329 B1 | 4/2002 | Sogard et al. | |
| 6,401,008 B1 | 6/2002 | Ehrichs et al. | |
| 6,417,068 B1 | 7/2002 | Bruce et al. | |
| 6,441,504 B1 | 8/2002 | Glenn et al. | |
| 6,525,805 B1 | 2/2003 | Heinle | |
| 6,555,441 B1 | 4/2003 | Ouellet | |
| 6,566,146 B1 | 5/2003 | Pang | |
| 6,768,539 B1 * | 7/2004 | Gui et al. | 355/53 |
| 2001/0032987 A1 | 10/2001 | Narui et al. | |
| 2001/0054723 A1 | 12/2001 | Narui et al. | |
| 2002/0163629 A1 * | 11/2002 | Switkes et al. | 355/53 |
| 2003/0168429 A1 | 9/2003 | Lai et al. | |

FOREIGN PATENT DOCUMENTS

| | | |
|---|---|---|
| JP | 51-093849 | 8/1976 |
| JP | 53143171 A | 12/1978 |
| JP | 60141235 | 7/1985 |
| JP | 62160722 | 7/1987 |
| JP | 62160723 | 7/1987 |
| JP | 62160772 | 7/1987 |
| JP | 62254423 A | 11/1987 |
| JP | 1-164032 | 6/1989 |
| JP | 01185922 | 7/1989 |
| JP | 01-264975 | 10/1989 |
| JP | 3-246923 | 11/1991 |
| JP | 05021317 | 1/1993 |
| JP | 05062871 A | 3/1993 |
| JP | 05114543 A | 5/1993 |
| JP | 08083753 A | 3/1996 |
| JP | 08111372 A | 4/1996 |
| JP | 09139342 A | 5/1997 |
| JP | 09312248 | 12/1997 |
| JP | 10-187937 | 7/1998 |
| JP | 10-209030 | 8/1998 |
| JP | 2000299276 A | 10/2000 |
| JP | 2002184665 A | 6/2002 |
| JP | 2002237588 | 8/2002 |
| JP | 2002280287 A | 9/2002 |
| JP | 2003-279318 | 10/2003 |
| WO | WO98/33096 | 7/1998 |
| WO | WO98/38597 | 9/1998 |
| WO | WO98/40791 | 9/1998 |

OTHER PUBLICATIONS

Patent Abstract of Japan, JP05144702, published Jun. 1993.

Patent Abstract of Japan, JP3246923, published Nov. 1991.

Patent Abstract of Japan, JP1164032, published Jun. 1989.

Katagiri et al., "Novel alignment technique for 0.1-μm lithography using the wafer rear surface and canceling tilt effect," *Optical Engineering* 32(10):2344-2349 (1993).

Everett et al., "Aligning lithography on opposite surfaces of a substrate," *Applied Optics* 31(34):7292-7294 (1992).

* cited by examiner

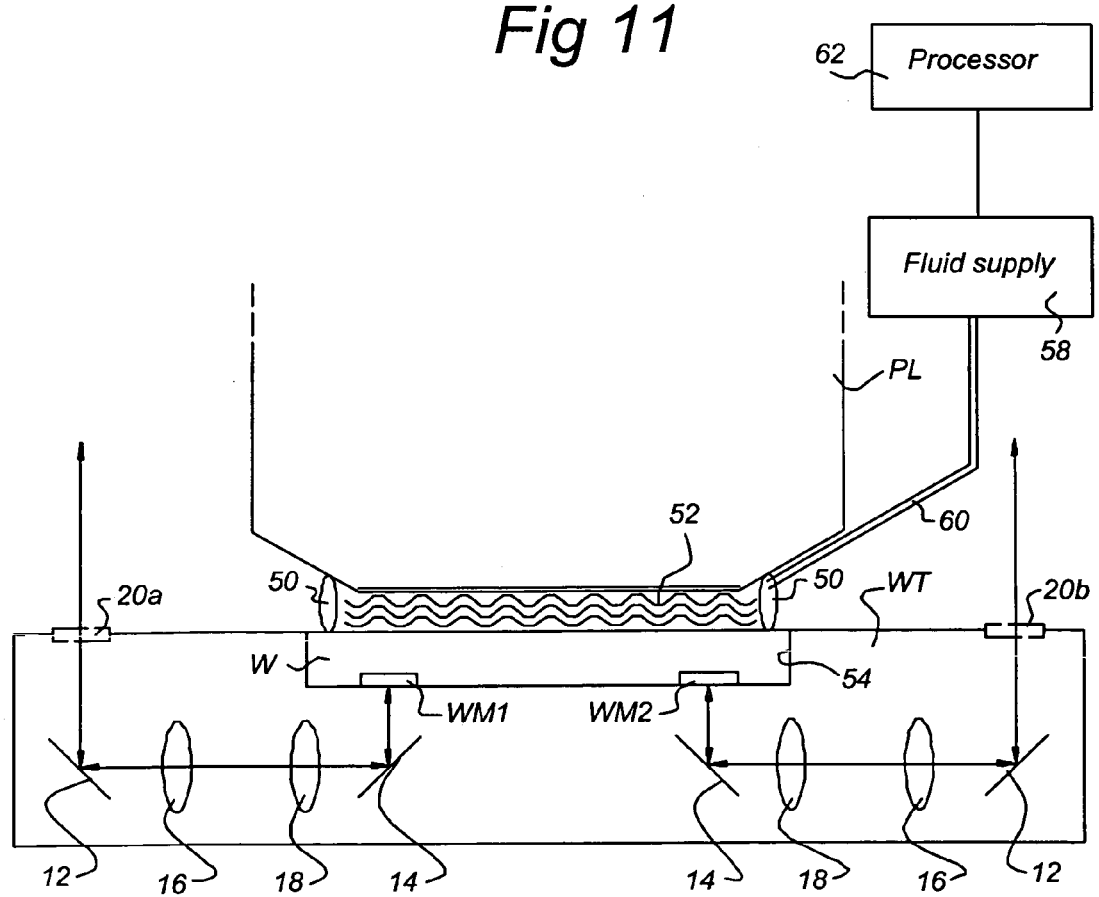

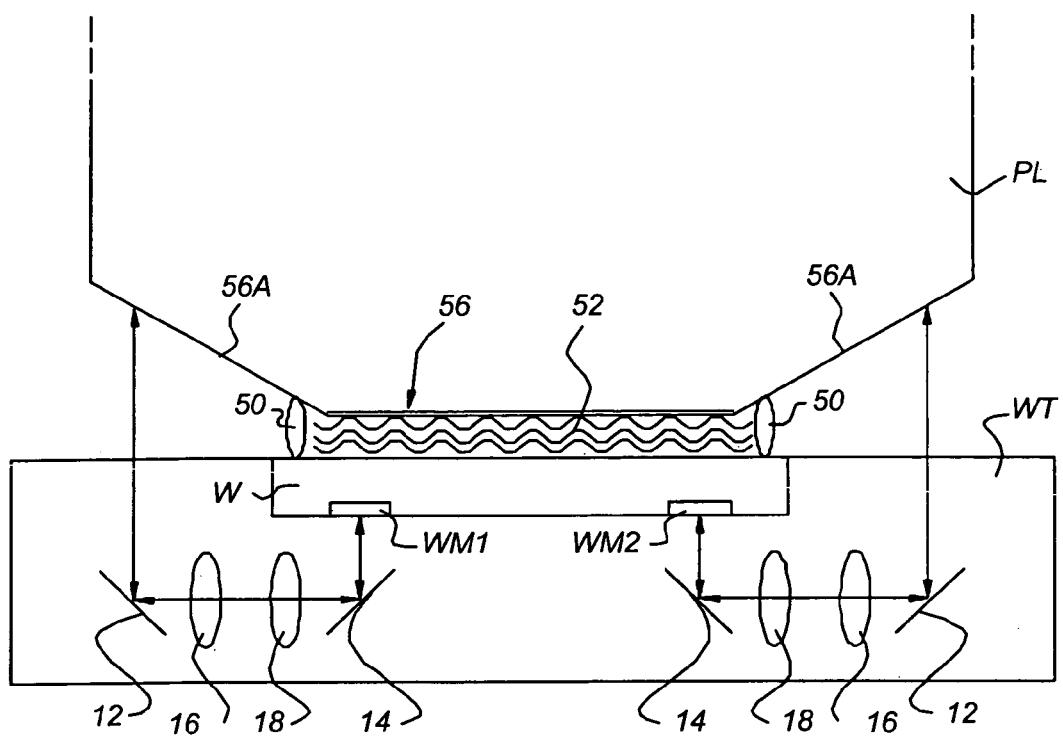

LITHOGRAPHIC APPARATUS

This is a continuation-in-part application of the U.S. patent application Ser. No. 10/803,104, filed Mar. 18, 2004 and Ser. No. 10/840,360, filed May 7, 2004, which are continuation applications of U.S. patent application Ser. No. 10/043,271 filed Jan. 14, 2002, now issued as U.S. Pat. No. 6,768,539, which claims priority to EP01300302.5, filed Jan. 15, 2001, the contents of all of which are incorporated herein by reference.

BACKGROUND OF THE INVENTION

1. Field of the Invention

The present invention relates generally to lithographic projection apparatus and methods for use thereof.

2. Description of the Related Art

The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, said pattern will correspond to a particular functional layer in a device being created in the target portion, such as an integrated circuit or other device (see below). Examples of such patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic circuits. In both of the situations described here above, the patterning device can comprise one or more programmable mirror arrays, More information on mirror arrays as here referred to can be gleaned, for example, from United States Patents Nos. 5,296,891 and 5,523,193, and PCT patent applications WO 98/38597 and WO 98/33096, which are incorporated herein by reference.

In the case of a programmable mirror array, the said support structure may be embodied as a frame or table, for example, which may be fixed or movable as required.

A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as here above set forth.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and U.S. Ser. No. 09/180,011, filed 27 Feb., 1998 (WO 98/40791), incorporated herein by reference.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (comprising one or more dies) on a substrate (silicon wafer) that has been coated with a layer of photosensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus according to the invention a pattern (e.g. in a mask) is imaged onto a substrate that is at least partially covered by a layer of energy-sensitive material (resist). Prior to this imaging step, the substrate may undergo various procedures, such as priming, resist coating and a soft bake.

After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504, incorporated herein by reference.

Alignment is the process of positioning the image of a specific point on the mask to a specific point on the wafer that is to be exposed. Typically one or more alignment marks, such as a small pattern, are provided on each of the substrate and the mask. A device may consist of many layers that are built up by successive exposures with intermediate processing steps. Before each exposure, alignment is performed to minimize any positional error between the new exposure and the previous ones, such error being termed overlay error.

However, some of the intermediate processing steps, such as chemical mechanical polishing (CMP), rapid thermal annealing, thick layer deposition and deep trench etching, can damage or distort the alignment marks on the substrate or bury them under opaque layers. This can cause overlay errors.

In some technologies, such as micro systems technology (MST) and micro electromechanical systems (MEMS), devices are fabricated from both sides of a substrate. There has been a problem with performing exposures on one side of a substrate such that they are accurately aligned with features previously exposed on the other side of the substrate. An alignment accuracy of the order of 0.5 microns or better is typically required.

New techniques are developed that allow the imaging of patterning devices, having even smaller patterns, by using so-called immersion techniques. This technique is based on the fact that the space between the lens and the substrate contains a fluid, such as water. Since the refractive index of water is higher than the refractive index of air of some low pressure gas, the numerical aperture of the system is increased. This allows to image even smaller patterns, while using the same radiation system and projection system. More information about immersion techniques can for instance be found in EP 1 420 298 A2, EP 1 429 188 and EP 1 420 300 A2.

The presence of water will however influence the alignment measurements. As a result of the presence of water in the space between the lens and the substrate, it becomes difficult to perform alignment measurements on marks provided on the substrate. Furthermore, comparing such 'wet' measurements with previously obtained 'dry' alignment measurements is also rather difficult.

In case a so-called dual stage lithographic apparatus is used, in which alignment measurements may be performed in a first 'dry' measurement position and exposure is done on a second 'wet' exposure position, still measurements must be performed at the second 'wet' position. When the substrate stage is 'swapped' from the 'dry' measurement position to the exposure position, the substrate stage also changes from first to second alignment devices, the first alignment devices being used at the first 'dry' measurement position and the second alignment devices being used at the second 'wet' position. Therefore, additional measurements must be performed at the exposure position, i.e. the 'wet' position, in order to use the previously obtained 'dry' measurements during exposure, thus at the exposure position. Also, the actual alignment of the substrate relative to the reticle can only be performed at the exposure position, i.e. the 'wet' position, since no reticle is present at the measurement position.

In case a single stage lithographic apparatus is used, all measurements must be performed at the exposure position.

In both cases, single and dual stage, alignment measurements must be performed at the 'wet' exposure position, while these measurements are preferably obtained in a 'dry' environment. A straightforward solution to align substrates on the 'wet' exposure position would be to perform all alignment measurements before the water is added. However, this would significantly reduce the throughput of the system.

The possibility to perform alignment measurements during applying water is not possible according to the prior art. This will briefly be explained. In general, two alignment arrangements may be used: an off-axis alignment arrangement and a so-called through-the-lens alignment arrangement (TTL).

An off-axis alignment arrangement can not be used during applying water in the space in between the lens and the substrate, since the off-axis alignment arrangement must, in order to perform measurements, come closes to the surface of the substrate. In order to apply water, the lens must also be brought in the vicinity of the substrate. Because of the dimensions of the lens as well as the off-axis alignment arrangement, it is not possible to have them both at the desired position at the same time, making it impossible to perform off-axis alignment measurements while applying water at the same time or while water is present.

Furthermore, it is not possible to perform a TTL-measurement during applying (filling) water. Such a TTL-measurement performs measurements by projecting an alignment beam via an alignment mark provided on the reticle, through the lens to an alignment mark provided on the substrate stage. Underneath this alignment mark provided on the substrate stage a measurement arrangement may be provided, such as for instance a light detector. It will be understood by a person skilled in the art that it is impossible to perform such measurements during applying water, since the rising water level would change the optical density and thus would change the path of the alignment beam and therefore disturb the measurements.

Techniques for performing TTL-alignment after applying water, thus when the water is present, are not developed yet. In some cases, such 'wet' measurements will need to be compared with previously obtained 'dry' measurements, which is also not straightforward. Finally, since applying water is a time-consuming action, the need arises to develop a more time-efficient procedure.

SUMMARY OF THE INVENTION

One aspect of embodiments of the present invention alleviates, at least partially, the above problems.

This and other aspects are achieved according to the invention in a lithography apparatus including a seal allowing a fluid to be present between the projection system and the substrate, an optical system for providing an image of said alignment mark for use by the alignment system, said optical system being constructed and arranged to direct the alignment radiation via the second side of the substrate.

Performing alignment measurements like this has the advantage that the fluid that is present or being provided in between the surface of the substrate and the lens, does not influence the alignment measurement.

According to an embodiment of the invention, the apparatus comprises a processor arranged to control said alignment system and to control a fluid supply such that said aligning is performed while said fluid supply supplies fluid between the projection system and the substrate. Performing alignment measurements while water is provided increases the throughput of the system.

According to embodiments of the invention, the immersion system is arranged to provide fluid between only part of the lens and the substrate, leaving part of the lens facing the substrate essentially free from water and where the optical system is arranged to direct the alignment radiation through the lens via the part of the lens being essentially free from water. This allows for through the lens alignment in combination with immersion techniques.

Other embodiments of the invention provide a device manufacturing method including providing a substrate that is at least partially covered by a layer of radiation-sensitive material on a first side, providing a projection beam of radiation using a radiation system, using a patterning device to produce a patterned beam of radiation by endowing the projection beam with a pattern in its cross-section, projecting the patterned beam of radiation onto a target area of the layer of radiation-sensitive material on the first side of said substrate, while a second side of said substrate faces a supporting substrate table, using an alignment system to align a pattern of the patterning device with an alignment mark provided on the substrate, providing a fluid between the projection system and the substrate, using an optical system to provide an image of said alignment mark for use by the alignment system, whereby said optical system directs the alignment radiation via the second side of the substrate, and aligning said image of said alignment mark with said pattern of said patterning device.

Throughout this specification, reference to an alignment mark being on a particular side of the substrate of course includes the alignment mark being etched into that side of the substrate, and includes the alignment mark having subsequent material deposited on top of it such that it is embedded and is no longer necessarily exposed at the surface.

Although specific reference may be made in this text to the use of the apparatus according to the invention in the manufacture of ICs or MEMs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "wafer" or "die" in this text should be considered as being replaced by the more general terms "substrate" and "target area", respectively.

In the present document, the terms radiation and beam are used to encompass all types of electromagnetic radiation, including ultraviolet radiation (e.g. with a wavelength of 365, 248, 193, 157 or 126 nm) and EUV (e.g. with a wavelength of 13.5 nm).

BRIEF DESCRIPTION OF THE DRAWINGS

Embodiments of the invention will now be described, by way of example only, with reference to the accompanying schematic drawings in which:

FIG. 11 is a schematic cross section illustrating the substrate table incorporating two branches of an optical system for double side alignment according to an embodiment of the invention using immersion lithography; and FIG. 12 is a schematic cross section illustrating the substrate table incorporating two branches of an optical system for double side alignment according to a further embodiment of the invention using immersion lithography.

DETAILED DESCRIPTION

In the Figures, corresponding reference symbols indicate corresponding parts.

Figure 1:
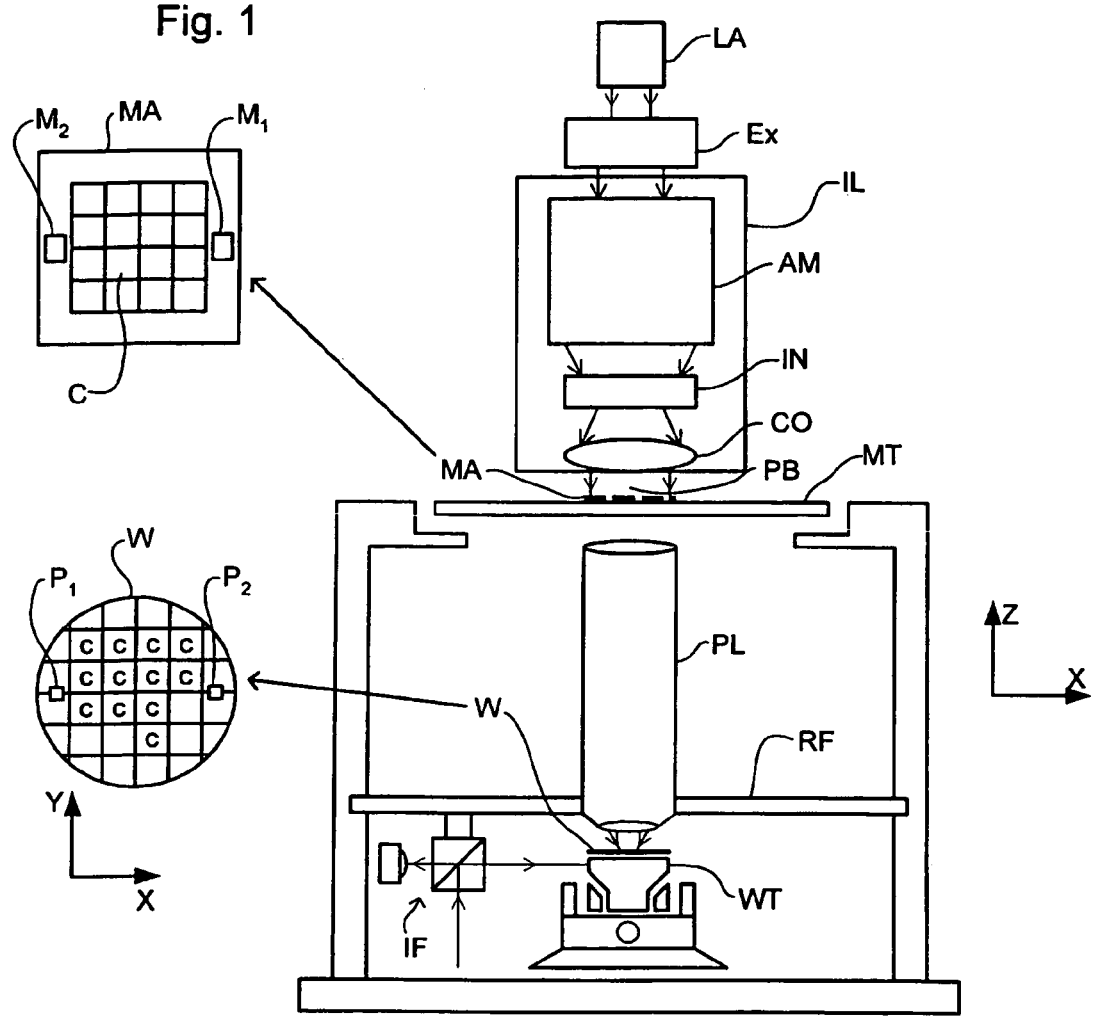
FIG. 1 depicts a lithographic projection apparatus.

FIG. 1 schematically depicts a lithographic projection apparatus. The apparatus comprises:

a radiation system LA, Ex, IL, for supplying a projection beam PB of radiation (e.g. UV radiation);

a first object table (mask table) MT for holding a mask MA (e.g. a reticle), and connected to first positioner for accurately positioning the mask with respect to item PL;

a second object table (substrate table) WT for holding a substrate W (e.g. a resist-coated silicon wafer), and connected to second positioner for accurately positioning the substrate with respect to item PL;

a projection system ("lens") PL (e.g. a quartz lens system, catadioptric or mirror system) for imaging an irradiated portion of the mask MA onto a target portion C (comprising one or more dies) of the substrate W.

As here depicted, the apparatus is of a transmissive type (i.e. has a transmissive mask). However, in general, it may also be of a reflective type (with a reflective mask), for example. Alternatively, the apparatus may employ another kind of patterning device, such as a programmable mirror array of a type as referred to above.

The radiation system comprises a source LA (e.g. a UV laser or a plasma source) that produces a beam of radiation.

This beam is fed into an illumination system (illuminator) IL, either directly or after being passed through conditioning optical elements, such as a beam expander Ex, for example. The illuminator IL comprises adjustable optical elements AM for setting the outer and/or inner radial extent (commonly referred to as □-outer and □-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the second positioners (and interferometric measuring system IF), the substrate table WT can be moved accurately, e.g. so as to position different target portions C in the path of the beam PB. Similarly, the first positioner can be used to accurately position the mask MA with respect to the path of the beam PB, e.g. after mechanical retrieval of the mask MA from a mask library, or during a scan. In general, movement of the object tables MT, WT will be realized with the aid of a long stroke module (coarse positioning) and a short stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
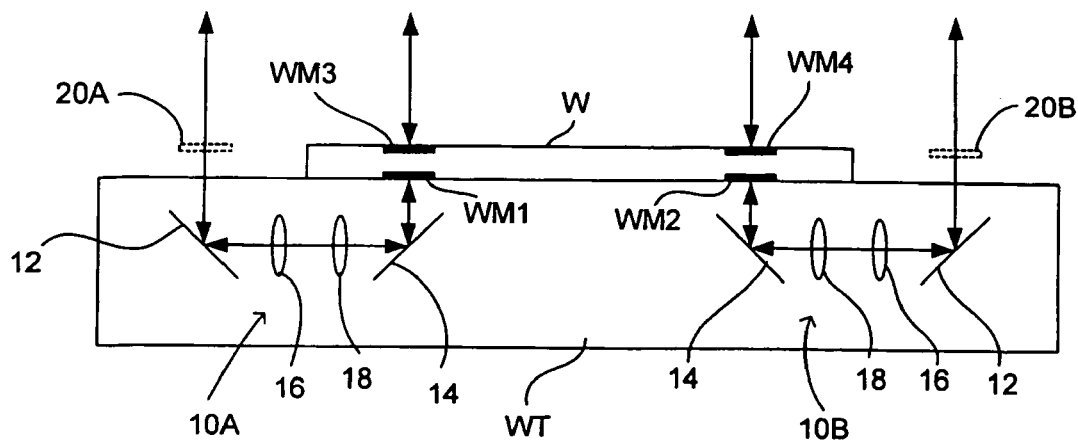
FIG. 2 is a schematic cross section illustrating the substrate table incorporating two branches of an optical system for double side alignment.

FIG. 2 shows a wafer W on a wafer table WT. Wafer marks WM3 and WM4 are provided on a first side ("front side") of the wafer W and light can be reflected from these marks, as indicated by the arrows above WM3 and WM4, and used for alignment with marks on a mask in conjunction with an alignment system (not shown) which will be described later. Further wafer marks WM1 and WM2 are provided on the second side ("back side") of the wafer W. An optical system is built into the wafer table WT for providing optical access to the wafer marks WM1, WM2 on the back side of the wafer W. The optical system comprises a pair of arms 10A, 10B. Each arm consists of two mirrors, 12, 14 and two lenses 16, 18. The mirrors 12, 14 in each arm are inclined such that the sum of the angles that they make with the horizontal is 90°. In this way, a beam of light impinging vertically on one of the mirrors will remain vertical when reflected off the other mirror.

In use, light is directed from above the wafer table WT onto mirror 12, through lenses 16 and 18, onto mirror 14 and then onto the respective wafer mark WM1, WM2. Light is reflected off portions of the wafer mark and returns along the arm of the optical system via mirror 14, lenses 18 and 16 and mirror 12. The mirrors 12, 14 and lenses 16, 18 are arranged such that an image 20A, 20B of the wafer mark WM1, WM2 is formed at the plane of the front (top) surface of the wafer W, corresponding to the vertical position of any wafer marks WM3, WM4 provided on the front side of the wafer W. The order of the lenses 16, 18 and the mirrors 12, 14 can, of course be different, as appropriate to the optical system. For example, lens 18 could be between the mirror 14 and the wafer W (see illustrations of later embodiments).

An image 20A, 20B of a wafer mark WM1, WM2 acts as a virtual wafer mark and can be used for alignment by the pre-exiting alignment system (not shown) in exactly the same way as a real wafer mark provided on the front (top) side of the wafer W.

Figure 3:
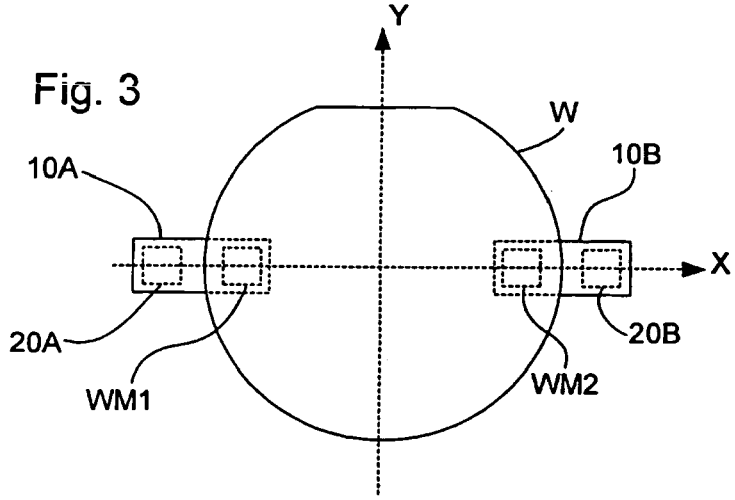
FIG. 3 is a plan view of a wafer showing the position and orientation of the double side alignment optics.
Figure 4:
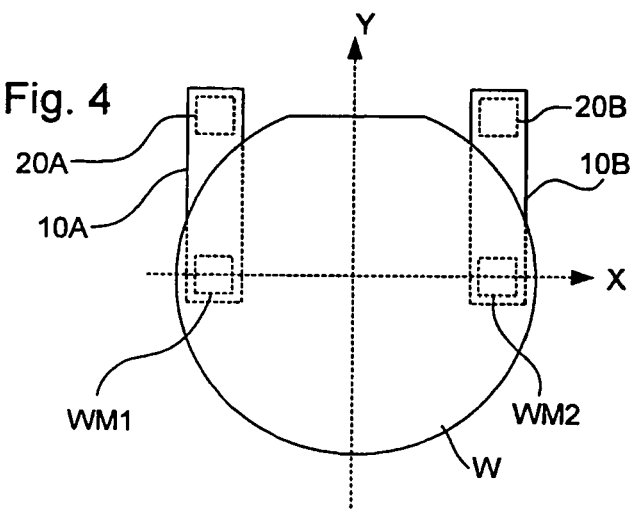
FIG. 4 is plan view showing an alternative position and orientation of the double side alignment optics.

As shown in FIG. 2, the arms of the optical system 10A, 10B produce images 20A, 20B which are displaced to the side of the wafer W so that they can be viewed by an alignment system above the wafer W. Two preferred orientations of the arms of the optical system 10A, 10B are shown in FIGS. 3 and 4, which are plan views of the wafer W, which lies in the XY plane. The wafer table WT is omitted from FIGS. 3 and 4 for clarity. In FIG. 3, the arms of the optical system 10A, 10B are aligned along the X axis. In FIG. 4, the arms of the optical system 10A, 10B are parallel to the Y axis. In both cases, the wafer marks WM1, WM2 lie on the X axis. The wafer marks WM1, WM2 are on the underside of the wafer W, so are reversed from the point of view of the top side of the wafer W. However, the arrangement of the mirrors of the arms of the optical system mean that the images 20A, 20B of the wafer marks WM1, WM2 are restored to be the correct way round again, not inverted, so that the images appear exactly the same as if they were on the top side of the wafer W. The optical system is also arranged so that the ratio of the size of a wafer mark WM1, WM2 to its image 20A, 20B is 1:1 i.e. there is no magnification or reduction. Consequently, the images 20A, 20B can be used exactly as if they were real wafer marks on the front side of the wafer W. A common alignment pattern or key provided on a mask can be used to perform alignment with both real and virtual wafer marks.

In the current example, wafer marks are provided on both the front and back sides of the wafer W at corresponding positions, as shown in FIG. 2. In FIGS. 3 and 4, only the wafer marks on the back side of the wafer W are shown, for clarity. According to this arrangement, when the wafer W is flipped over, by rotation about either of the X or Y axes, a wafer mark which was on the top side of the wafer W is now on the underside, but at a position such that it can be imaged by an arm of the optical system 10A, 10B.

It will be noted that, because of the mirror arrangement, displacement of the wafer in one direction parallel to an arm 10A, 10B of the optical system will displace the corresponding image 20A, 20B of a wafer mark WM1, WM2 on the under side of the wafer in the opposite direction. For example, in FIG. 3, if the wafer W were displaced to the right, the images 20A, 20B would be displaced to the left. Software controlling the alignment system takes this into account when determining the position of the wafer marks WM1, WM2 and when adjusting the relative positions of the wafer W and a mask when performing alignment. If the two of the optical system 10A, 10B are symmetric then the separation between the images 20A and 20B will in fact stay constant when the wafer is displaced.

At least two wafer marks are provided per side of the wafer W. A single mark can give information about the relative positioning of an image of a specific point on a mask to a specific point on the wafer. However, to ensure the correct orientational alignment and magnification, at least two marks are used.

Figure 5:
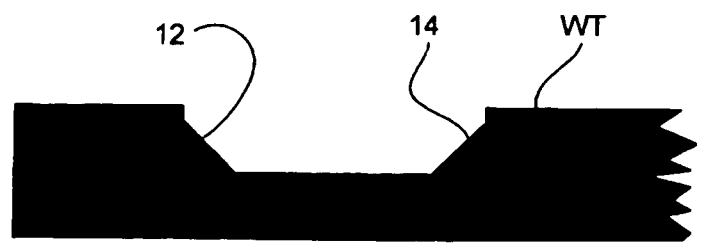
FIG. 5 is a cross section of a portion of a substrate table having integral optical components.

FIG. 5 shows a portion of the wafer table WT in cross section. According to this embodiment of the invention, the optical system 10A, 10B for imaging the wafer marks on the back side of a wafer is built into the wafer table in a particular fashion. As shown in FIG. 5, the mirrors 12, 14 of an arm of the optical system are not provided as discrete components, but are integral with the wafer table WT. Appropriate faces are machined into the wafer table WT, which may then be provided with a coating to improve reflectivity, thus forming the mirrors 12, 14. The optical system is made from the same material as the wafer table, such a Zerodur™, which has a very low coefficient of thermal expansion and therefore ensures that high alignment accuracy can be maintained.

Figure 6:
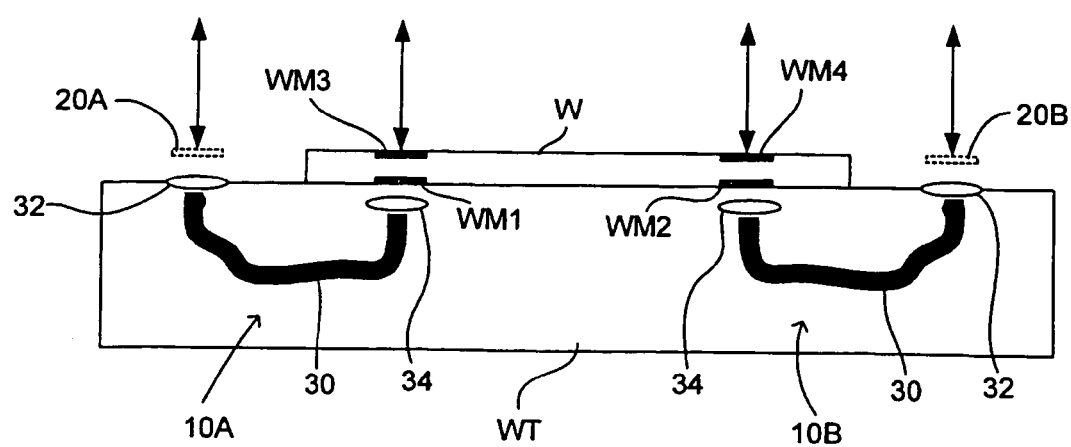
FIG. 6 is a schematic cross section of a substrate table showing the optical system for double side alignment.

FIG. 6 is a view corresponding to that of FIG. 2, but with the arms 10A, 10B of the optical system embodied using respective optical fibers 30 (or coherent optical fiber bundles) and lenses 32, 34 to couple light into and out of the fibers 30. The fibers and lenses are used to provide an image 20A, 20B of a wafer mark WM1, WM2 on the back side of the wafer W. The images 20A, 20B are located in the same plane as the wafer marks WM3, WM4 on the front side of the wafer W.

Figure 7:
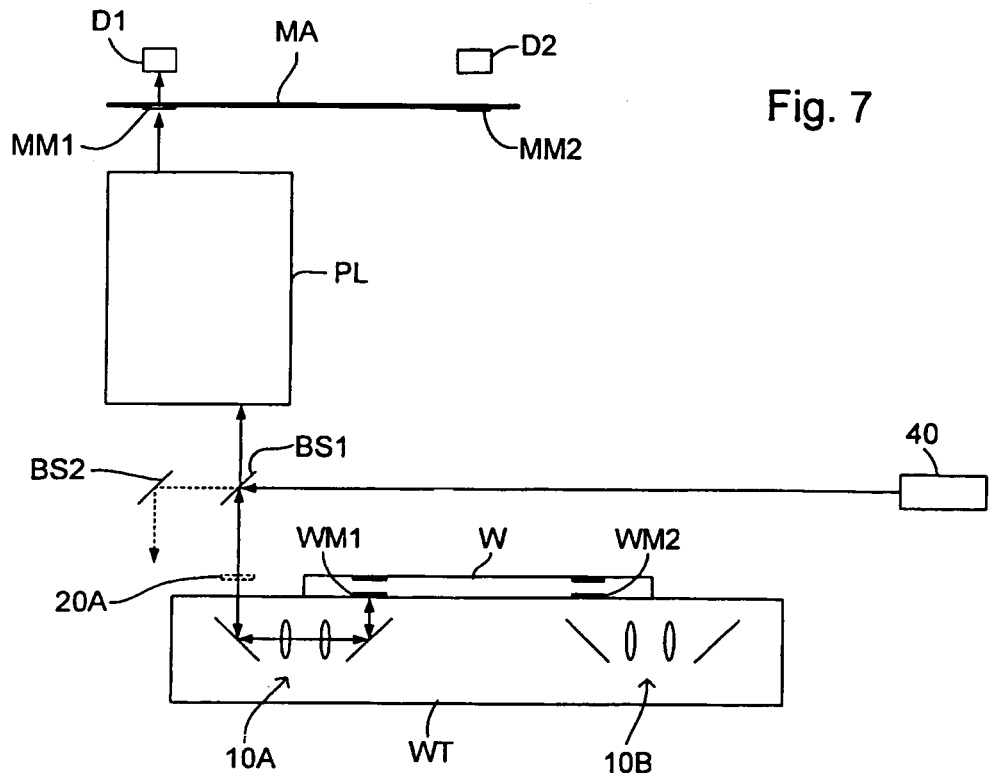
FIGS. 7 and 8 illustrate schematically the alignment optics for the alignment of two wafer marks with two mask marks.
Figure 8:
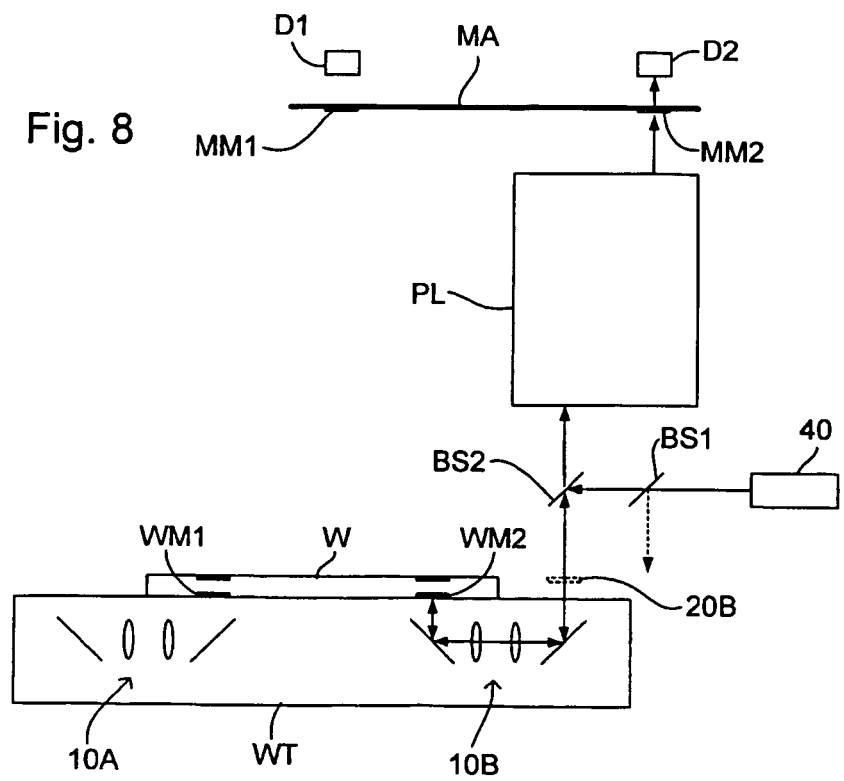

FIGS. 7 and 8 illustrate further aspects of the alignment system. In FIG. 7, a source of radiation, such as a laser 40, e.g. a HeNe laser, directs a beam of alignment light onto a first beam splitter BS1, whereby a portion of the light is directed down through the arm 10A of the optical system in the wafer table WT, and is reflected off a first wafer mark WM1 on the back side of the wafer W, to form an image 20A of the alignment mark. Light from this image 20A passes back through the first beam splitter BS1, through a lens system PL and then through a first mask mark MM1 provided on a mask MA and onto a first detector D1. The signal produced by the detector D1 can be used to determine correct registration between the first mask mark MM1 and the image 20A. The relationship between the image 20A and the wafer mark WM1 is known from the optics 10A, and so alignment between the first mask mark MM1 and the first wafer mark WM1 can be determined. The wafer W and/or mask MA can be moved relative to one another to achieve alignment.

The alignment system of this example is a through-the-lens (TTL) arrangement, such that the lens system PL between the mask MA and the wafer W is actually the projection lens used for the exposure radiation. However, the alignment system can also be off-axis (OA).

In FIG. 8, a second wafer mark WM2 is aligned with a second mask mark MM2, using a second beam splitter BS2 and the other arm 10B of the optical system. The process can be repeated to align, for example, the first mask mark MM1 with the second wafer mark WM2 and so on. Alignments can also be performed with wafer marks provided on the front (top) side of the wafer and the same or further mask marks.

An example of a double side alignment method is as follows. First wafer marks are provided on a first side of a wafer. One or more exposures are performed on that side using the first wafer marks for alignment in the usual way. Thus the position of features on the first side of the wafer relative to those first wafer marks is well established. The wafer is turned over so that the first side is now facing down and so that exposures can be performed on the second side. Using the optical system in the wafer table, the first wafer marks are imaged and are aligned relative to marks on a mask, so that the position and orientation of features on the first side (now the underside) of the wafer relative to the mask is established. Second wafer marks can then be exposed on the second side of the wafer (now on top) (or the second wafer marks could already have been provided). The relative position and orientation of the second wafer marks with respect to the first wafer marks can be determined through the mask marks and the alignment system. Exposures of features can then be done on the second side of the wafer, using the second wafer marks, and any necessary correction to ensure that they are accurately aligned with the features on the first side of the wafer. Once the relative relationship between the wafer marks on the first and second sides of the wafer is known, exposures can be performed on either side using either or both sets of marks whilst ensuring accurate alignment with features on the opposite side of the wafer.

If device features are to be formed on only one side of the wafer, the same apparatus can be used, but using only wafer marks on the back side of the wafer for alignment. The masks for all exposures on the front side can be aligned using the images of the back side wafer marks. It is not necessary to know the absolute relationship between the wafer marks on the back side and the features exposed on the front side, provided all masks for exposure on the front side are consistently aligned using the images of the back side wafer marks. The wafer marks on the back side will not become deteriorated because the processing is done on the front side of the wafer.

Figure 9:
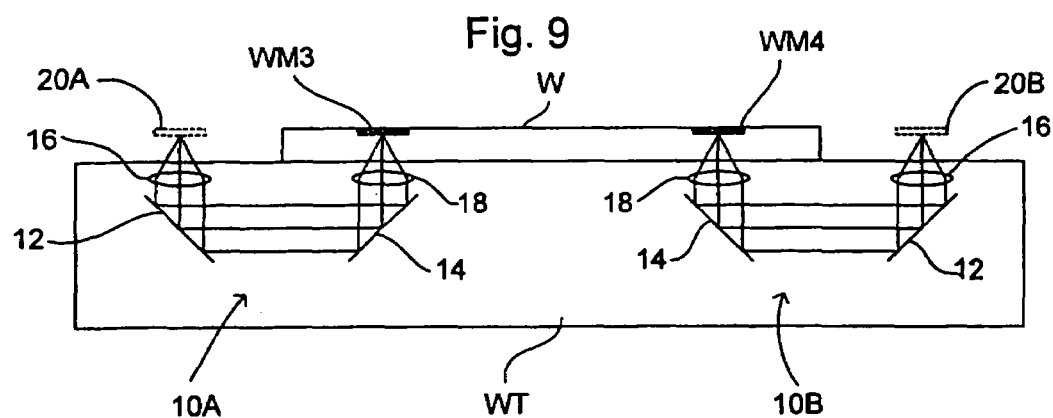
FIG. 9 is a schematic cross-section of a substrate table, wafer and optical system for alignment according to a further embodiment of the invention in which alignment radiation is transmitted through the wafer.

FIG. 9 shows an arrangement essentially the same as the examples in FIG. 2 and FIG. 6, except that the arms of the optical system 10A, 10B are arranged to image wafer marks WM3 and WM4, which are on the front side of the wafer W, by transmitting radiation through the wafer W via the back side of the wafer W. For example, in the case of a silicon wafer, infrared radiation is used in the alignment system because silicon is transmissive to infrared radiation.

An advantage of performing alignment imaging through the wafer, using an optical system for providing optical access from the back side of the wafer W, is that the quality of the alignment is less susceptible to deterioration caused by subsequent processing performed on the front side of the wafer, and even an opaque layer, for example of metal, could be deposited on top of the wafer marks without hindering the alignment. This embodiment could, of course, be used with further wafer marks on the back side of the wafer W, but using wafer markers on the front side means that it is not necessary to process the back side of the wafer to provide wafer marks, unless desired.

Figure 10:
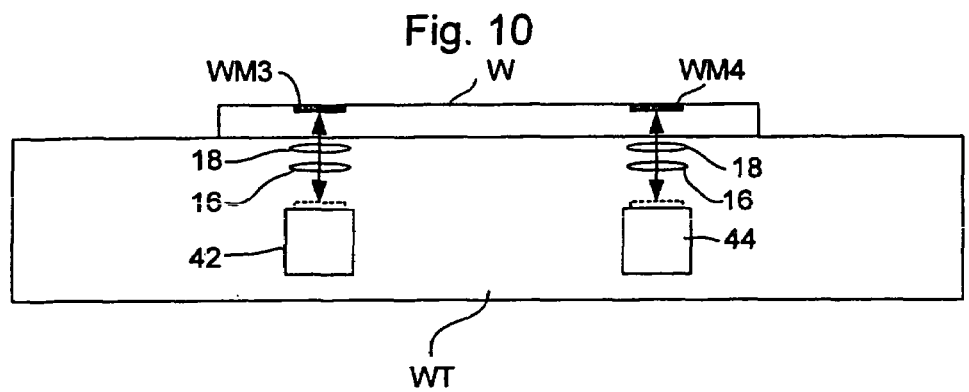
FIG. 10 is a schematic cross-section of a substrate table, wafer and optical system for alignment.

FIG. 10 shows a further example in which alignment radiation is transmitted through the wafer W via the back side of the wafer to wafer marks WM3, WM4 on the front side, and detectors 42, 44 in the wafer table WT derive the location of the wafer marks on the wafer W relative to the wafer table WT. This arrangement could equally be applied to wafer marks on the back side of the wafer using an alignment system for transmitting alignment radiation through the wafer to and from the front side.

In embodiments of the invention in which an optical system is provided such that the alignment system can have optical access to the back side of the wafer, also known as back side alignment optics (BSAO), for example as shown in FIGS. 2, 6 and 9, calibration techniques are necessary. Several different ones are described below.

1. To calibrate the actual length of the BSAO, assuming the nominal length of the BSAO is known:

A set (e.g. 3) of ultra flat blank test silicon wafers are used.

Step 1: A set of marks is exposed in resist on one side of the wafers, and the marks are developed and etched on the wafers.

Step 2: Each wafer is flipped over, and a set of marks is exposed on the other side of each wafer using the BSAO for aligning the marks from step 1, using the nominal length of the BSAO as a parameter (machine constant) for the apparatus.

Step 3: Each of the wafers is flipped over once again and a set of marks is exposed on the first side with a predetermined offset, e.g. 500 nm. The overlay error between the first set of marks and this set of marks can be averaged and this value used to calculate the actual length of the back side alignment optics.

2. The optical performance of the BSAO can be calibrated in the following way, using a set (e.g. 3) of ultra flat blank test silicon wafers, and provided the actual length of the BSAO is known:

Step 1: A set of marks is exposed in resist on one side of each of the wafers, the marks are developed and etched on the wafers.

Step 2: The wafers are flipped over and a set of marks is exposed on the other side of each wafer using the BSAO for alignment to the first marks which are now on the back side of each wafer, and using the known actual length of the BSAO as a machine constant.

Step 3: The wafers are flipped over once again and a set of marks is exposed on the first side of each wafer with a certain offset, e.g. 500 nm, the overlay errors between the first set of marks and this set of marks are related to the quality of the BSAO, and the distortion of the BSAO can be calculated using known techniques.

3. A small temperature variation in the wafer table or directly in the BSAO due to environmental temperature fluctuation or substrate temperature differences can result in length of variation of the BSAO, which will have consequences for the overlay accuracy. This error can be reduced as follows:

A set of thermal probes is embedded in the BSAO and the temperature variation of the BSAO and wafer table are monitored. The length variation of the BSAO can be deduced from the temperature measurements and can be monitored in real time and can be compensated for.

4. Calibration of the BSAO with fiducial alignment marks.

The length of each arm of the BSAO (10(a), 10(b)) can be set as machine constants. The distance between any BSAO and fiducial marks on the wafer table can also be set as machine constants.

A set of fiducial alignment marks is made on each end of the BSAO. The actual lengths of the BSAO can be calibrated by aligning the reticle alignment marks to these fiducial marks.

The distance between the fiducial marks on the stage and that on either end of the BSAO can be calibrated as well. The variation of this distance can be monitored.

Such calibrations may be done on each branch of the BSAO.

Such calibrations can be done regularly, e.g. once per day, per week, per month and so on, as desired, such that that short calibration can be done and also such that the long-term drift can be monitored and compensated by updating the machine constants.

EMBODIMENT 1

In order to image patterns having smaller patterns, immersion techniques have been developed. According to this technique, a fluid system is used so that the space in between the lens PL and the surface of the substrate W is, at least partially, filled with a fluid, such as water. This is shown in FIG. 11, in which the fluid is indicated by a wavy pattern 52. In order to prevent the fluid from draining away, a sealing 50 may be provided. Other immersion devices are provided, such as a fluid supply 58, arranged to supply fluid via a duct 60. A processor 62 controls the fluid supply 58. More information about immersion techniques can be found in EP 1 420 298 A2.

As can be seen in FIG. 11, in which like reference numerals refer to the same components/devices as in previous figures, the substrate table WT is provided with an opening 54 for receiving the substrate W, the opening 54 having dimensions similar to those of the substrate W. As a result of this, the upper surface of the substrate W is now substantially aligned with the upper surface of the substrate table WT, which allows positioning of the lens PL near the edge of the substrate W, without leaking fluid, as will readily be understood by a person skilled in the art and can be seen in FIG. 11, where the sealing 50 depicted on the right hand side of the lens PL is positioned above the substrate table WT.

As already discussed above, the lithographic projection apparatus could be a single stage machine, but may also be a multiple stage machine, such as a dual stage machine.

In case a single stage machine is used, after the substrate W is positioned on the substrate table WT, alignment measurements need to be carried out on the substrate W at the exposure position. In case a dual stage machine is used, the substrate W is positioned on the substrate stage WT, the substrate stage WT being at a first position, remote from the exposure position. Alignment measurements can be carried out at this first position and after that, the stage is 'swapped' to a second position, i.e. the exposure position. However, since the first and the second positions are provided with different measurement and positioning devices (e.g. at the exposure position interferometric measuring devices IF are used), at the exposure position additional alignment measurements need to be performed. All these actions, including swapping and the alignment measurements are controlled by one or more processors, e.g. processor 62.

So, whether a single or a multiple stage machine is used, at least some alignment measurements need to be carried out at the exposure position. These alignment measurements are preferably carried out on a 'dry' substrate, rather than on a 'wet' substrate.

In the prior art the alignment system may be a through-the-lens (TTL) arrangement, such that the lens system PL between the mask MA and the wafer W is actually the projection lens used for the exposure radiation. However, in the prior art the alignment system may alternatively be off-axis.

In both cases, providing a fluid like water between the lens PL and the substrate W results in difficulties. In case a TTL-arrangement is used, the presence of water will influence the measurements and in case an off-axis arrangement is used, the dimensions of the measurement arrangement and the lens PL do not allow for performing measurements while the water is present or being provided.

As soon as the water is supplied, the lens PL needs to be in a position just above the substrate, as is shown in FIG. 11. As a result of this, also off-axis alignment measurements can no longer be performed, since the presence and the dimensions of the lens PL make it impossible for such an off-axis alignment arrangement to be positioned such that measurements can be carried out on the substrate W.

Summarizing, prior art off-axis alignment as well as prior art TTL-alignment can not be performed when water is present, i.e. not after the water has been applied and not during applying the water.

According to the invention, the alignment problems that occur when applying immersion techniques, can be solved by using the alignment techniques as described above. By providing wafer marks WM1, WM2 on the back side of the substrate W, alignment measurements may be performed via the backside of the substrate W. As a result of this, the water between the lens PL and substrate W does not influence the measurements. Therefore, in an advantageous embodiment, the processor 62 is arranged to control fluid supply 58 and the alignment measurement such that the alignment measurement is already performed while the fluid supply 58 is still providing fluid via duct 60. It is observed that, for the sake of simplicity, not all devices used for alignment are repeated in FIG. 11. However, they may be the same as in the previous figures.

Embodiment 2

FIG. 12, in which like reference numerals refer to the same components/devices as in previous figures, shows a further embodiment according to the present invention. In this embodiment a through-the-lens (TTL) arrangement is used in combination with immersion techniques. According to this embodiment, the lens PL has a front surface 56 opposing the substrate table WT, having a portion (or portions) 56A that is (or are) not contacting the fluid. The sealing 50 is positioned such that the fluid is only provided to part of the front surface 56, while leaving portion 56A of the lens PL facing the substrate W essentially free from fluid. This allows for traveling of the alignment beam through the lens PL, while not passing through the fluid.

Both embodiments discussed with reference to FIGS. 11 and 12 allow processor 62 to control performing alignment measurements while simultaneously supplying water. This significantly improves the throughput of the system, since the alignment measurement does not have to wait for the supply of fluid to be finished.

It will be understood that all the alignment techniques discussed in this document may all be used in combination with immersion techniques. The substrate W may be provided with alignment marks on a first and/or a second side of the substrate, while exposures may be performed on a single or both sides of the substrate W, as is for instance shown in FIG. 2. So, if required, alignment marker WM3 and WM4 may also be used (cf. a.o., FIG. 2). However, it will be understood that the substrate W may also be provided with alignment marks on one side, being either the front side or the back side, where the front side is the side where exposures are carried out. In case the alignment marks are provided only on the front side, the techniques described with reference to FIG. 9 and FIG. 10 are applicable.

Also the technique described with reference to FIG. 6, using optical fibers 30, is applicable, as will readily be understood by a person skilled in the art.

Whilst specific embodiments of the invention have been described above, it will be appreciated that the invention may be practiced otherwise than as described. The description is not intended to limit the invention.

What is claimed is:

1. A lithographic projection apparatus comprising:
a support structure for supporting a patterning device, the patterning device serving to pattern a beam of radiation according to a desired pattern;
a substrate table for holding a substrate, the substrate having a first side and a second side;
a projection system for imaging the patterned beam onto a target portion on a first side of the substrate, while the second side of the substrate faces the substrate table;
an alignment system for aligning a pattern of the patterning device with an alignment mark provided on the substrate, using alignment radiation;
a fluid system constructed and arranged to allow a fluid to be present between the projection system and the substrate;
an optical system for providing an image of said alignment mark for use by the alignment system, said optical system being constructed and arranged to direct the aligmnent radiation via the second side of the substrate, and
a processor arranged to control said alignment system and to control a fluid supply of the fluid system such that said aligning is performed while said fluid supply supplies fluid between the projection system and the substrate.

2. Apparatus according to claim 1, wherein said optical system is arranged to provide an image of said alignment mark at the plane of the first side of the substrate.

3. Apparatus according to claim 1, wherein said optical system comprises an optical system for providing a plurality of images, each corresponding to a respective one of a plurality of alignment marks.

4. Apparatus according to claim 1, wherein said optical system comprises at least two mirrors and lenses.

5. Apparatus according to claim 1, wherein said optical system comprises at least one optical fiber.

6. Apparatus according to claim 1, wherein the optical system is arranged to provide the alignment mark image displaced laterally from the corresponding alignment mark and beyond the periphery of the area to be occupied by the substrate.

7. Apparatus according to claim 1, wherein said alignment mark is on the second side of the substrate.

8. Apparatus according to claim 7, wherein said alignment system is embodied to perform alignment using a reference mark provided on the first side of the substrate as well as using said alignment mark image provided by said optical system.

9. Apparatus according to claim 1, wherein:
said alignment mark is on the first side of the substrate;
said alignment radiation is substantially transmissible through the material of said substrate; and
said optical system directs said alignment radiation to the alignment mark through the substrate.

10. Apparatus according to claim 9, wherein the alignment radiation comprises infra-red radiation.

11. Apparatus according to claim 1, wherein the alignment radiation and the projection beam have substantially the same wavelength.

12. Apparatus according to claim 1, wherein the fluid system is arranged to provide fluid between only part of the lens and the substrate, such that part of the lens facing the substrate is substantially free from the fluid and where the optical system is arranged to direct the alignment radiation through the lens via the part of the lens that is substantially free from water.

13. Apparatus according to claim 1, wherein the fluid system is arranged such that the entire substrate is covered by the fluid.

14. Device manufacturing method comprising:
projecting a patterned beam of radiation through a fluid and onto a first side of a substrate, using a patterning device, while a second side of said substrate faces a supporting substrate table;
aligning a pattern of the patterning device with an image of an alignment mark provided on the substrate; and
imaging said alignment mark by directing alignment radiation via the second side of the substrate,
wherein said aligning is performed while said fluid is between a projection system of a lithographic apparatus used in the method and the substrate.

15. Method according to claim 14, further comprising:
turning over the substrate so that said first side and said second side are swapped; and
repeating the alignment.

16. Method according to claim 14, wherein a projection system of a lithographic apparatus used in the method has a front surface facing said substrate and the fluid is provided to only part of the front surface, leaving part of the front surface essentially free from fluid and further comprising:
directing the alignment radiation via the second side of the substrate and via the part of the front surface being essentially free from fluid.

17. A method according to claim 14, wherein the fluid comprises water.

18. A lithographic projection apparatus comprising:
a support structure for supporting a patterning device, the patterning device serving to pattern a beam of radiation according to a desired pattern;
a substrate table for holding a substrate, the substrate having a first side and a second side;
a projection system for imaging the patterned beam onto a target portion on a first side of the substrate, while the second side of the substrate faces the substrate table;
an alignment system, located on a same side of the substrate as the projection system, for aligning a pattern of the patterning device with an alignment mark provided on the substrate, using alignment radiation;
a fluid system constructed and arranged to allow a fluid to be present between the projection system and the substrate; and
an optical system for providing an image of said alignment mark for use by the alignment system, said optical system being constructed and arranged to direct the alignment radiation via the second side of the substrate,
wherein said alignment system and said fluid system are constructed and arranged such that the aligning of said pattern is performed while said fluid system supplies fluid between the projection system and the substrate.

* * * * *